(12) United States Patent
Djrbashian et al.

(10) Patent No.: US 10,830,375 B1
(45) Date of Patent: Nov. 10, 2020

(54) FLAT ELECTRICAL CABLE GRIPPING TOOL

(71) Applicant: KARMA AUTOMOTIVE LLC, Irvine, CA (US)

(72) Inventors: Edward Djrbashian, Irvine, CA (US); Chris Aragon, Irvine, CA (US)

(73) Assignee: KARMA AUTOMOTIVE LLC, Irvine, CA (US)

( * ) Notice: Subject to any disclaimer, the term of this patent is extended or adjusted under 35 U.S.C. 154(b) by 0 days.

(21) Appl. No.: 16/406,491

(22) Filed: May 8, 2019

(51) Int. Cl.
*F16L 3/10* (2006.01)
*H01B 7/08* (2006.01)
*H05K 1/02* (2006.01)

(52) U.S. Cl.
CPC .............. *F16L 3/1091* (2013.01); *H01B 7/08* (2013.01); *H05K 1/02* (2013.01); *H05K 2201/10356* (2013.01); *H05K 2201/10393* (2013.01)

(58) Field of Classification Search
CPC .. F16L 3/109; H01B 7/08; H05K 1/02; H05K 2201/10356; H05K 2201/10393
USPC ........ 248/62, 65, 74.1, 74.4, 231.61, 231.85
See application file for complete search history.

(56) References Cited

U.S. PATENT DOCUMENTS

| | | | | |
|---|---|---|---|---|
| 2,288,158 A * | 6/1942 | Ellinwood | ............ | F16L 3/2235 174/135 |
| 2,396,836 A * | 3/1946 | Ellinwood | ............ | F16L 3/2235 174/135 |
| 2,404,531 A * | 7/1946 | Robertson | ............. | F16L 3/2235 248/68.1 |
| 3,695,563 A * | 10/1972 | Evans | ...................... | F16L 3/227 248/56 |
| 3,856,244 A * | 12/1974 | Menshen | ................ | F16L 3/237 248/67.5 |
| 3,894,706 A * | 7/1975 | Mizusawa | ............. | F16L 3/1025 248/68.1 |
| 4,175,728 A * | 11/1979 | Ferguson | .................. | F16L 3/04 24/16 R |
| 4,244,083 A * | 1/1981 | Aremka | .................... | F16L 3/10 24/16 R |
| 5,971,663 A * | 10/1999 | Brothers | ............... | F16L 3/1091 138/107 |
| 6,257,898 B1 * | 7/2001 | Serizawa | ............ | B60R 16/0215 174/135 |
| 6,446,915 B1 * | 9/2002 | Ismert | ....................... | F16L 3/24 248/68.1 |
| 6,752,359 B2 * | 6/2004 | Nagenkogl | ............. | F16B 2/065 248/228.5 |
| 7,694,918 B2 * | 4/2010 | Zhang | .................... | B30B 15/00 248/231.9 |

(Continued)

*Primary Examiner* — Terrell L McKinnon
*Assistant Examiner* — Michael McDuffie
(74) *Attorney, Agent, or Firm* — Gordon Rees Scully Mansukhani, LLP

(57) ABSTRACT

A tool for gripping a flexible flat electrical cable, the tool having a top and bottom support with the bottom support having a pair of upwardly extending cable alignment notches and the top support having a cushioned strip that is receivable between the pair of cable alignment notches. A flexible electrical cable is sandwiched between the top and bottom supports and is held in an aligned position when the top and bottom supports are fastened together. The top support has at least one thumb grip thereon, and the thumb grip is angled towards one side of the top support.

20 Claims, 5 Drawing Sheets

(56) References Cited

U.S. PATENT DOCUMENTS

| | | | | |
|---|---|---|---|---|
| 7,988,110 B1* | 8/2011 | Liang | ............... | H05K 7/12 |
| | | | | 248/221.11 |
| 8,596,589 B2* | 12/2013 | Hennon | ............... | F16L 3/222 |
| | | | | 248/65 |
| 9,732,884 B1* | 8/2017 | Keller | ............... | F16L 3/2235 |
| 2007/0137888 A1* | 6/2007 | Takahashi | ............... | H02G 3/32 |
| | | | | 174/260 |
| 2010/0265644 A1* | 10/2010 | Yu | ............... | G06F 1/185 |
| | | | | 361/679.02 |
| 2010/0270439 A1* | 10/2010 | Li | ............... | F16L 3/1075 |
| | | | | 248/65 |
| 2015/0001868 A1* | 1/2015 | Mancuso, Jr. | ............... | A01M 31/006 |
| | | | | 294/137 |
| 2017/0247001 A1* | 8/2017 | Callahan | ............... | F16L 3/237 |
| 2018/0166815 A1* | 6/2018 | Bussmann | ............... | H01R 12/716 |
| 2019/0120408 A1* | 4/2019 | Milner | ............... | F16B 2/065 |
| 2019/0323632 A1* | 10/2019 | Bechtold | ............... | H02G 3/32 |

* cited by examiner

FLAT ELECTRICAL CABLE GRIPPING TOOL

BACKGROUND

The present system relates to tools for gripping flexible flat electrical cables.

Flexible, flat electrical cables come in many forms and are commonly used when connecting to electrical components that have been mounted onto printed circuit boards. These flexible flat electrical cables are commonly used for data or power transmission between various electrical assemblies. Unfortunately, electrical cables that have been mounted onto printed circuit boards can become loose over time. This is especially problematic in the automotive context where vibrations from the vehicle can jar the electrical components loose.

In one exemplary use in the electronic automotive industry, flat flexible electrical cables are used to connect a battery modules cell temperature/voltage flex circuit to a module control unit circuit board. Unfortunately, the vibration of the automobile in turn vibrates the flexible electrical connecting cables which loosens the cables from the circuit board. In fact, failure rates of 20% or more have been encountered when connecting the battery modules cell temperature/voltage flex circuit to the module control unit circuit board.

What is instead required is a system or tool for holding these flexible electric cables in one position relative to the printed circuit board. Ideally, such a system would support the cable at a location close to the end of the cable where the cable's electrical component is mounted onto the printed circuit board. This sort of tool would also have the benefit of preventing improper installation or damage of the flexible cable to the electrical component.

SUMMARY

The present system provides a tool for gripping a flat electrical cable and holding the cable in a secure position. A benefit of the present gripping tool is that it prevents the electrical cable's end connector from becoming loose from a printed circuit board over time. An additional benefit of the present gripping tool is that it also holds the flexible electrical cable in a preferred orientation (i.e.: preferably holding the electrical cable in a direction passing perpendicular to the gripping tool itself). As such, the gripping tool can be mounted right next to the location where the electrical cable's end connector is mounted onto the circuit board. An advantage of supporting the cable at its terminal end (i.e.: close to the electrical connector mounted at its end) is that it prevents vibrations in the flexible cable from reaching the electrical component. This prevents vibrations in the electrical cable from prying the cable's end connector loose from the circuit board.

In preferred aspects, the present tool comprises: a bottom support body having a pair of cable alignment notches extending upwardly therefrom; a top support body fastenable onto the bottom support body, the top support body having a cushioned strip that is receivable between the pair of cable alignment notches; at least one thumb grip extending upwardly from the top support body; and at least one fastening element securing the top support body to the bottom support body.

Preferably, the cushioned strip is made of rubber and the cable alignment notches are disposed parallel to one another running laterally across a top surface of the bottom support body. As such, when the top and bottom support bodies are fastened together, the flexible electrical cable is sandwiched therebetween, and secured into position. The top and bottom support bodies may optionally be secured together with bolts, or other suitable connectors.

Preferably, a pair of thumb grips are provided with the thumb grips being angled towards one side of the top support body. This has the advantage of keeping the installer's fingers out of the way when tightening the bolts to secure the tool together and mount it onto the circuit board.

DETAILED DESCRIPTION

Figure 1:
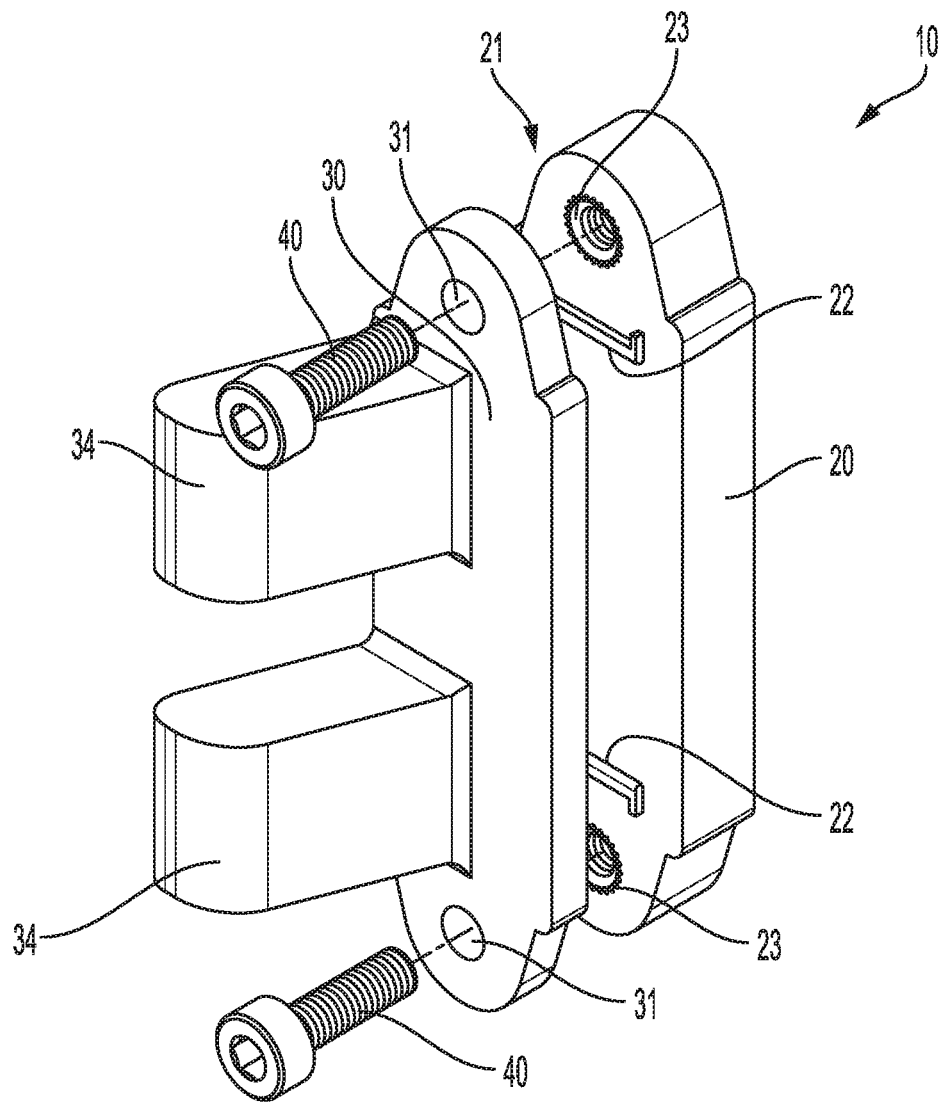
FIG. 1 is an exploded perspective view of the present flat electrical cable gripping tool.
Figure 2:
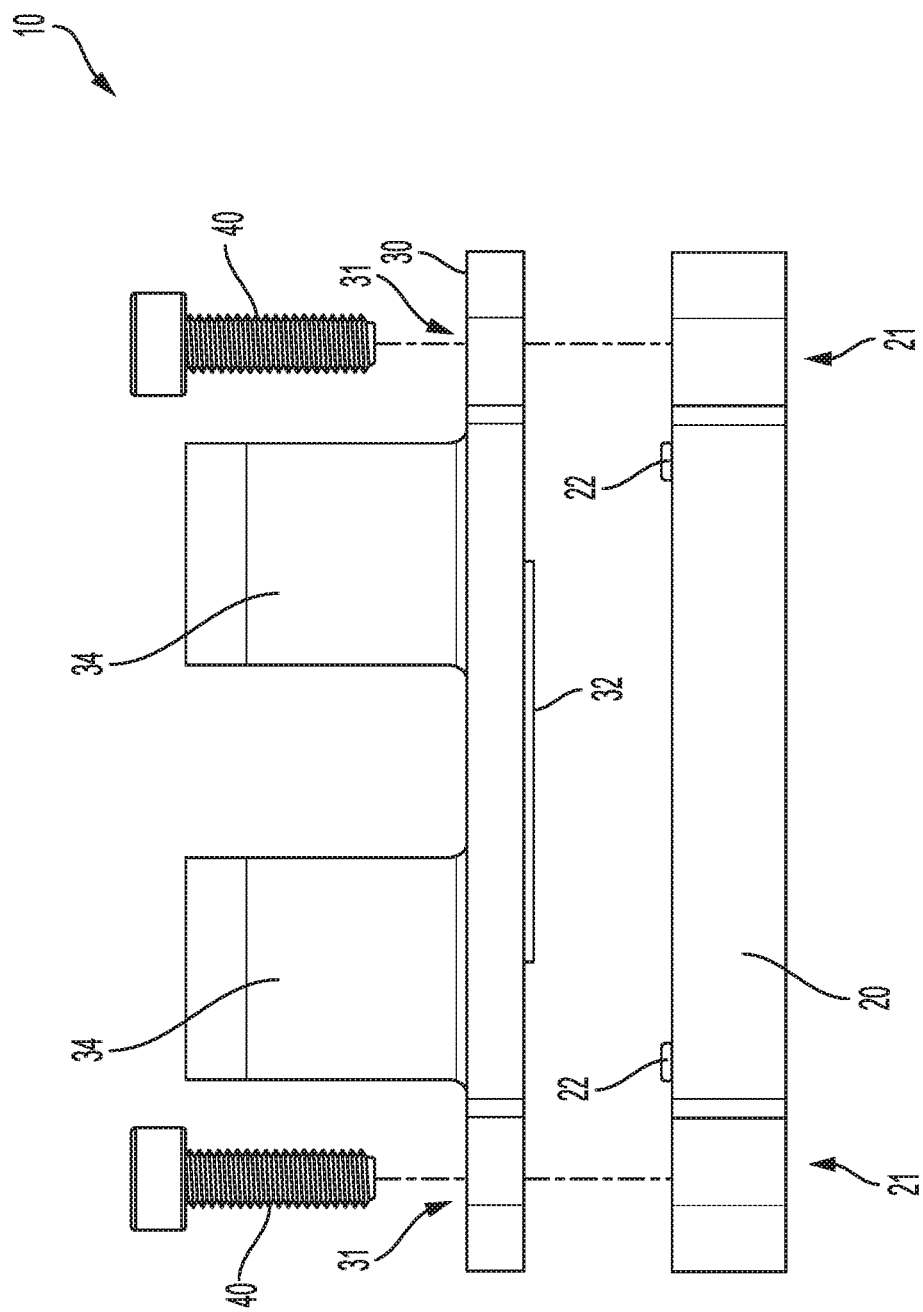
FIG. 2 is an exploded side elevation view of the present flat electrical cable gripping tool.

In preferred aspects illustrated in FIGS. 1 and 2, gripping tool 10 comprises: a bottom support body 20 having a pair of cable alignment notches 22 extending upwardly therefrom, and a top support body 30 fastenable onto bottom support body 20. The top support body 30 preferably has a cushioned strip 32 extending downwardly that is receivable between the pair of cable alignment notches 22 when the tool is assembled. In preferred aspects, at least one thumb grip 34 extends upwardly from top support body 30. At least one fastening element 40 both secures the top support body 30 onto the bottom support body 20, and secures the bottom support 20 onto a printed circuit board or other object.

In preferred aspects, cushioned strip 32 is made of rubber. However, other suitable materials are also contemplated, all keeping within the scope of the present system. Preferably, cable alignment protrusions 22 are disposed parallel to one another and also extend laterally across a top surface of bottom support body 20, as shown. In alternate embodiments, the positions of the cable alignment protrusions and the cushioned strip can be reversed.

Figure 3:
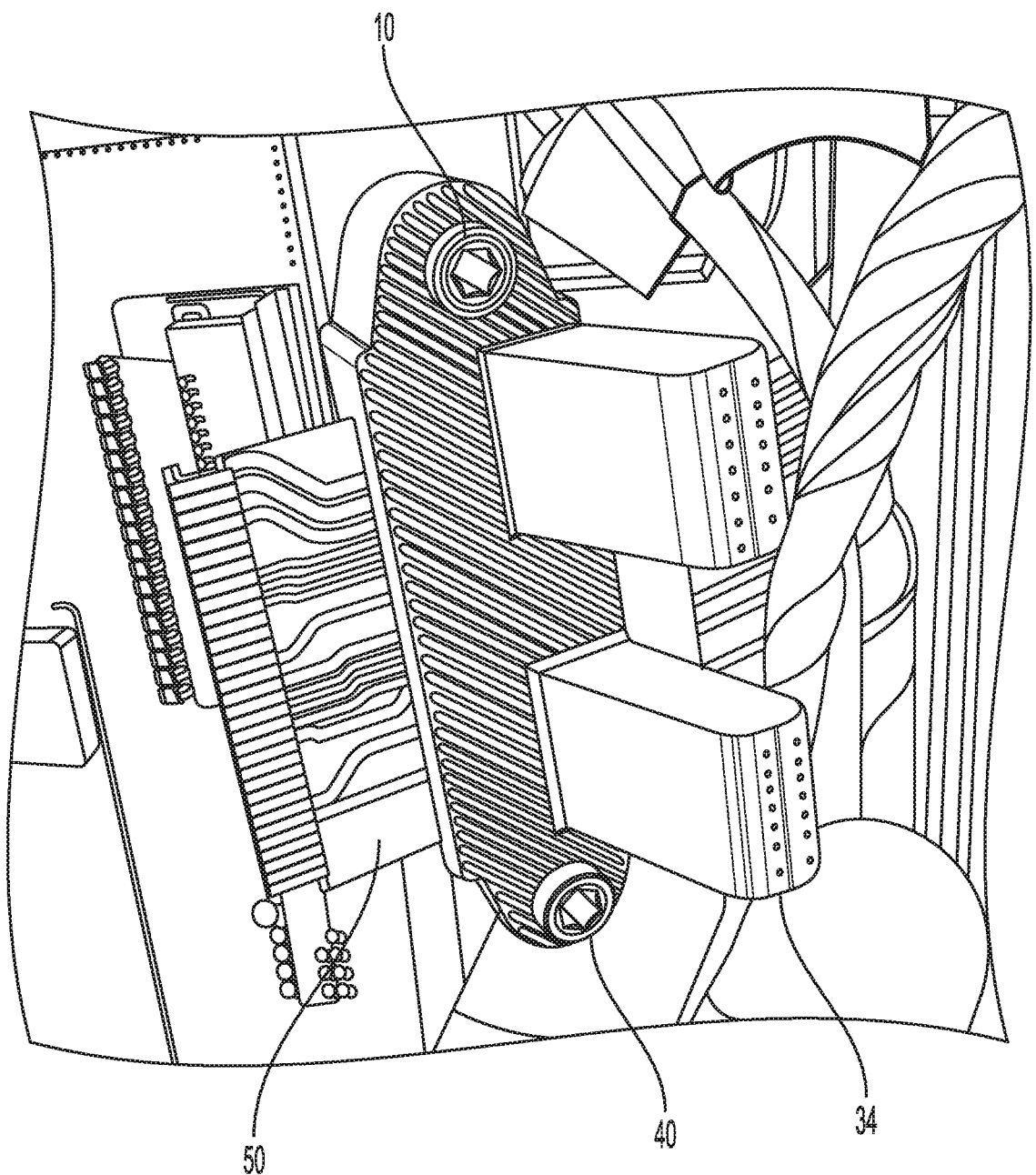
FIG. 3 is an assembled view of the view of the present cable gripping tool holding a flat cable therein with the cable gripping tool mounted onto the side of the printed circuit board.

In operation, as best seen in FIG. 3, a flexible electrical cable 50 is positioned between the top and bottom support bodies 20 and 30, and the top and bottom support bodies are fastened together (thereby sandwiching cable 50 therebetween, as shown).

The present tool advantageously grips securely onto cable 50 without crushing it. As such, in preferred dimensions, the cable alignment protrusions 22 project upwardly a distance of approximately 1 mm or 2 mm from bottom support 20, such that the top and bottom support bodies 30 and 20 are also preferably positioned approximately 1 mm or 2 mm apart when secured together. It is to be understood that these preferred dimensions will depend upon the particular dimensions of the cable in use. As such, a thicker cable 50 will preferably be held with bottom and top support bodies 20 and 30 positioned farther apart. Conversely, in the case of a thinner cable 50, bottom and top support bodies 20 and 30 will be positioned closer together. By selecting the suitable distance which alignment protrusions 22 project upwardly, a system to prevent overtightening onto cable 50 is provided. Specifically, for thicker cables 50, alignment protrusions 22 will project farther upwards, whereas for thinner cables 50, alignment protrusions 22 will not be as thick.

In preferred embodiments, the at least one fastening element comprises a pair of bolts 40 passing through holes 31 in top support body 30 and holes 21 bottom support body 20. Optionally, a threaded insert 23 can also be provided received into holes 21 in bottom support 20. An optional advantage of threaded insert 23 is that it can be used to provide a threadable insert (i.e. a "nut") into which bolt 40 is received. In additional preferred embodiments, an optional compression limiter can be provided in threaded insert 23 to prevent overtightening. Preferably, threaded insert 23 is made of a non-conducting material and top and bottom supports 20 and 30 are optionally made of plastic.

Preferably, the upper support body of tool 10 has a pair of knob-like thumb grips 34 extending therefrom. As best seen in FIG. 3, thumb grips 34 are preferably angled or positioned away from the center or middle of top support body 30. The benefit of thumb grips 34 being positioned off center is that the installer's fingers will thereby be positioned to the side and unable to interfere with the tightening of bolts 40. Moreover, an advantage of having a pair of thumb grips 34 is that it saves material (as compared to one long thumb grip extending the entire length of the device).

Figure 4:
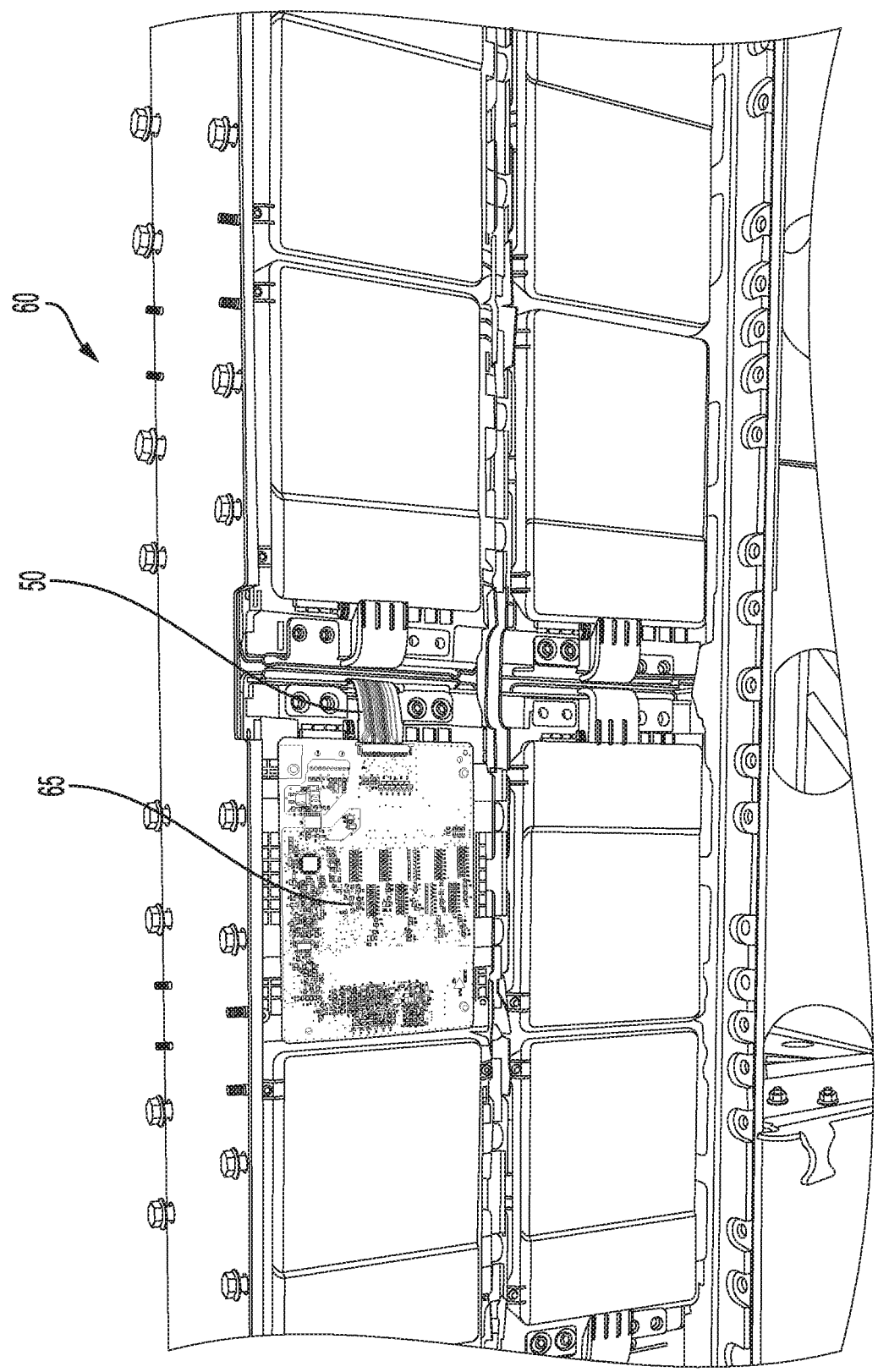
FIG. 4 is an illustration of a battery modules cell temperature/voltage flex circuit connected with a cable to a module control unit circuit board. (The present cable gripping tool has been removed for clarity).
Figure 5:
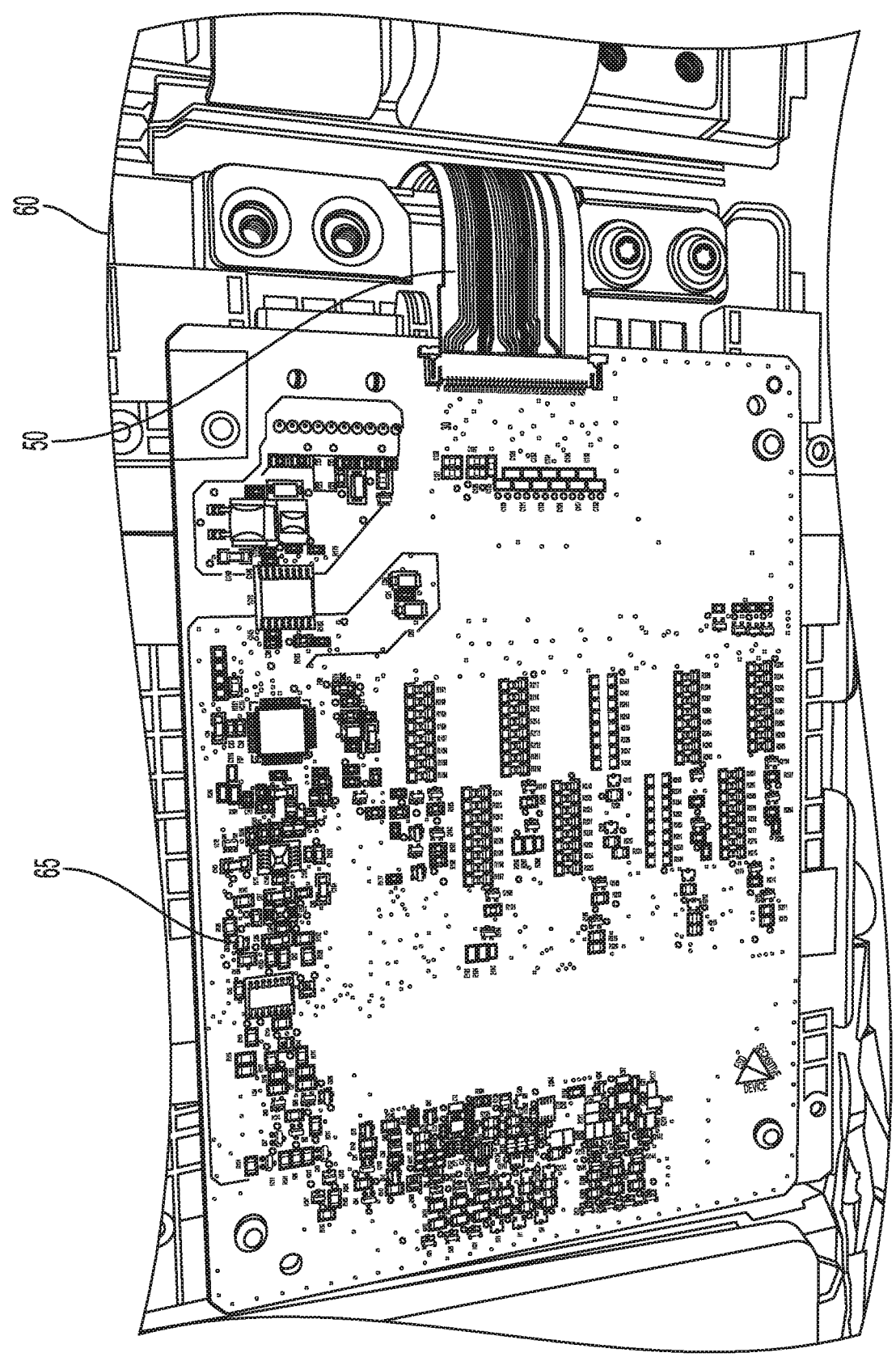
FIG. 5 is a close up illustration corresponding to one module control unit circuit board of FIG. 4.

Lastly, FIGS. 4 and 5 illustrate a preferred use of the present cable gripping tool wherein a battery modules cell temperature/voltage flex circuit 60 is connected with a cable 50 to a module control unit circuit board 65. FIG. 5 is a close up illustration corresponding to one module control unit circuit board of FIG. 4. The present cable gripping tool has been removed for clarity to show the exemplary components which are connected together with cable 50. In operation, cable gripping tool is simply installed over cable 50 (as seen in FIG. 3).

What is claimed is:

1. A tool for gripping a flat electrical cable, comprising:
a bottom support body having a pair of cable alignment protrusions extending upwardly from a top surface of the bottom support body;
a top support body fastenable onto the bottom support body, the top support body having a cushioned strip located on a bottom surface of the top support body so that the cushioned strip is receivable between the pair of cable alignment protrusions when the bottom support body and top support body are fastened together with the flat electrical cable located between the top surface of the bottom support body and the bottom surface of the top support body, and wherein the top surface of the bottom support body is parallel to the bottom surface of the top support body;
at least one thumb grip extending upwardly from a top surface of the top support body; and
at least one fastening element securing the top support body to the bottom support body.

2. The tool of claim 1, wherein the cushioned strip comprises rubber.

3. The tool of claim 1, wherein the cable alignment protrusions extend laterally along the bottom support body and wherein the protrusions are parallel to one another.

4. The tool of claim 1, wherein the cable alignment protrusions extend laterally across the top surface of the bottom support body.

5. The tool of claim 1, wherein the cable alignment protrusions project upwardly a distance of 1 mm to 2 mm from the bottom support.

6. The tool of claim 1, wherein the top and bottom support bodies are positioned approximately 1 mm to 2 mm apart when secured together.

7. The tool of claim 1, wherein the at least one fastening element comprises a pair of bolts passing through holes in the top and bottom support bodies.

8. The tool of claim 7, further comprising: a threaded insert passing through the holes in the bottom support.

9. The tool of claim 1, wherein the at least one thumb grip comprises a pair of thumb grips.

10. The tool of claim 1, wherein the thumb grip is positioned offset from the middle of the top support body.

11. The tool of claim 1, wherein the at least one fastening element secures the top and bottom support bodies to a printed circuit board.

12. A tool for gripping a flat electrical cable, comprising:
a bottom support body having a pair of upwardly extending cable alignment protrusions;
a top support body removably connected to the bottom support body, wherein the top support body includes a cushioned strip that is located between the pair of cable alignment protrusions when the top support body is connected to the bottom support body and wherein the top and bottom support bodies are configured for receiving the electrical cable therebetween and in contact with the cushioned strip;
a thumb grip extending upwardly from the top support body; and
a fastening element securing the top support body to the bottom support body;
wherein the cushioned strip is parallel to a top surface of the bottom support body and wherein the tool is configured for the cable to be in contact with the cable and the top surface of the bottom support body.

13. The tool of claim 12, wherein the protrusions extend laterally and in a parallel alignment along the top surface of the bottom support body.

14. The tool of claim 13, wherein the thumb grip is located away from the middle of a top surface of the top support body in order to facilitate tightening of the fastening element.

15. A tool for gripping a flat electrical cable, comprising:
a bottom support body having a pair of cable alignment protrusions extending upwardly from a top surface of the bottom support body;
a top support body removably connected to the bottom support body, wherein the top support body includes a cushioned strip located on a bottom surface of the top support body;
a thumb grip extending upwardly from a top surface of the top support body;
wherein the top surface of the bottom support body is parallel to the bottom surface of the top support body and the cushion strip is positioned so that when the flat electrical cable is being gripped between the top and bottom support bodies the cushion strip and the top surface of the of the bottom support surface contact the cable between the protrusions;
a thumb grip extending upwardly from a top surface of the top support body; and
a fastening element securing the top support body to the bottom support body.

16. The tool of claim 15, wherein the thumb grip is positioned on the top surface of the top support body at a location away from the middle of the top surface in order to facilitate tightening of the fastening element.

17. The tool of claim 15, wherein the thumb grip comprises a pair of knobs.

18. The tool of claim 15, wherein the alignment protrusions extend laterally and parallel across the top surface of the bottom support body.

19. The tool of claim 18, wherein the thumb grip comprises a pair of knobs.

20. The tool of claim 19, wherein each of the knobs is positioned on the top surface of the top support body at a location away from the middle of the top surface in order to facilitate tightening of the fastening element.

* * * * *